US009613721B2

(12) United States Patent
Kim

(10) Patent No.: US 9,613,721 B2
(45) Date of Patent: Apr. 4, 2017

(54) SEMICONDUCTOR MEMORY CAPABLE OF PERFORMING THROUGH-CHIP VIA TEST AND SYSTEM USING THE SAME

(71) Applicant: SK hynix Inc., Icheon-si, Gyeonggi-do (KR)

(72) Inventor: Ji Hwan Kim, Icheon-si (KR)

(73) Assignee: SK HYNIX INC., Icheon-si (KR)

( * ) Notice: Subject to any disclaimer, the term of this patent is extended or adjusted under 35 U.S.C. 154(b) by 42 days.

(21) Appl. No.: 14/636,917

(22) Filed: Mar. 3, 2015

(65) Prior Publication Data

US 2016/0189802 A1 Jun. 30, 2016

(30) Foreign Application Priority Data

Dec. 30, 2014 (KR) .......................... 10-2014-0192994

(51) Int. Cl.
*G11C 29/00* (2006.01)
*G11C 29/02* (2006.01)
*G11C 29/44* (2006.01)

(52) U.S. Cl.
CPC ............ *G11C 29/82* (2013.01); *G11C 29/025* (2013.01); *G11C 29/4401* (2013.01); *G11C 2029/4402* (2013.01)

(58) Field of Classification Search
CPC ....... G11C 29/00; G11C 29/14; G11C 29/806; G11C 7/20; G06F 13/4247; G01R 31/317; G01R 31/318
USPC ...................... 714/718; 257/777, 778; 326/9
See application file for complete search history.

(56) References Cited

U.S. PATENT DOCUMENTS

| 7,073,018 | B1 * | 7/2006 | James ................ G06F 12/0653 711/108 |
| 2005/0082664 | A1 * | 4/2005 | Funaba ................ H01L 23/544 257/724 |
| 2011/0084722 | A1 * | 4/2011 | Nishioka ................ G11C 5/02 324/762.01 |
| 2012/0007624 | A1 * | 1/2012 | Byeon ..................... G11C 7/10 324/750.15 |
| 2012/0104388 | A1 * | 5/2012 | Choi .................... G11C 29/806 257/48 |
| 2012/0154008 | A1 * | 6/2012 | Kim ................... G06F 13/4247 327/202 |
| 2012/0182042 | A1 * | 7/2012 | Jeong ...................... G11C 7/20 326/9 |

(Continued)

OTHER PUBLICATIONS

Y. He, X. Zhao, C. Zhang and Z. Wang, "A fully integrated Chip-ID tag used in chip information identification," 2012 IEEE International Conference on RFID (RFID), Orlando, FL, 2012, pp. 172-176.*

(Continued)

*Primary Examiner* — Cynthia Britt
(74) *Attorney, Agent, or Firm* — William Park & Associates Ltd.

(57) ABSTRACT

A semiconductor memory may include a plurality of stacked semiconductor chips which are interconnected using through-chip vias. The semiconductor memory may set chip IDs of the respective semiconductor chips by using a chip code such that the chip IDs are different from each other, and perform a through-chip via test for the plurality of stacked semiconductor chips by changing the chip IDs of the respective semiconductor chips during a test mode period.

18 Claims, 4 Drawing Sheets

(56) References Cited

U.S. PATENT DOCUMENTS

2016/0078906 A1* 3/2016 Yamaguchi ............ G11C 5/025
365/51

OTHER PUBLICATIONS

Y. Su, J. Holleman and B. P. Otis, "A Digital 1.6 pJ/bit Chip Identification Circuit Using Process Variations," in IEEE Journal of Solid-State Circuits, vol. 43, No. 1, pp. 69-77, Jan. 2008.*

S. Rosenblatt et al., "Field Tolerant Dynamic Intrinsic Chip ID Using 32 nm High-K/Metal Gate SOI Embedded DRAM," in IEEE Journal of Solid-State Circuits, vol. 48, No. 4, pp. 940-947, Apr. 2013.*

H. Fujiwara et al., "A stable chip-ID generating physical uncloneable function using random address errors in SRAM," 2012 IEEE International SOC Conference, Niagara Falls, NY, 2012, pp. 143-147.*

* cited by examiner

SEMICONDUCTOR MEMORY CAPABLE OF PERFORMING THROUGH-CHIP VIA TEST AND SYSTEM USING THE SAME

CROSS-REFERENCES TO RELATED APPLICATION

The present application claims priority under 35 U.S.C. §119(a) to Korean application number 10-2014-0192994 filed on Dec. 30, 2014, in the Korean Intellectual Property Office, which is incorporated herein by reference in its entirety.

BACKGROUND

1. Technical Field

Embodiments generally relate to an integrated circuit, and more particularly, in one or more embodiments, to a semiconductor memory and a system.

2. Related Art

A three-dimensional ("3D") integrated circuit is an integrated circuit manufactured by stacking a plurality of semiconductor chips.

The plurality of semiconductor chips may transmit and receive signals between each other by interconnecting them using through-chip vias.

The 3D integrated circuits having through-chip vias need to be tested to identify faulty through-chip vias or connections.

SUMMARY

Various embodiments are directed to a semiconductor memory which is capable of setting a chip ID and performing a through-chip via test by sharing circuit configurations and through-chip vias, and a semiconductor system using the same.

In an embodiment of the present disclosure, a semiconductor memory may include a plurality of chips which are stacked to transmit/receive signals through through-chip vias. The semiconductor memory may set chip IDs of the respective chips to different values using a chip code, and perform a through-chip via test for the plurality of stacked chips by changing the chip IDs of the respective chips during a test mode period.

In an embodiment of the present disclosure, a semiconductor system may include: a semiconductor memory configured to set chip IDs of a plurality of chips to different values using a chip code, and perform a through-chip via test for the plurality of stacked chips by changing the chip IDs of the respective chips during a test mode period; a processor configured to provide external codes having different values, calculated according to the number of the plurality of chips in the semiconductor memory, to the semiconductor memory to perform the through-chip via test; and a substrate configured to provide a signal path for communication between the processor and the semiconductor memory.

BRIEF DESCRIPTION OF THE DRAWINGS

Features, aspects, and embodiments are described in conjunction with the attached drawings, in which.

DETAILED DESCRIPTION

Hereinafter, a semiconductor memory and a system according to various embodiments of the present disclosure will be described below with reference to the accompanying drawings.

Figure 1:
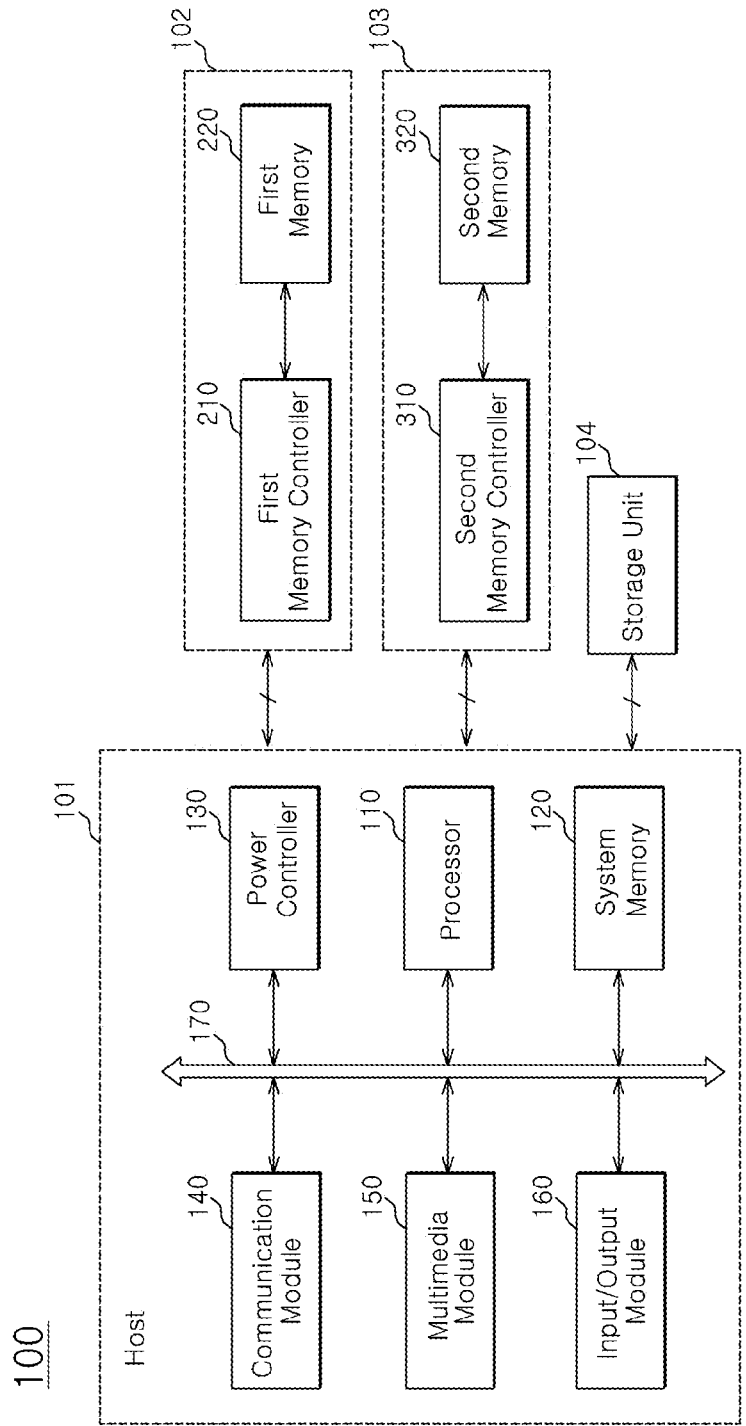
FIG. 1 is a block diagram illustrating a configuration example of an electronic device 100 according to an embodiment of the present disclosure.

FIG. 1 is a block diagram illustrating a configuration example of an electronic device 100 according to an embodiment of the present disclosure.

The electronic device 100 may indicate a computing device or a system which can execute computer-readable commands. Examples of the electronic device may include workstations, laptops, client-side terminals, servers, distributed computing systems, handheld devices, video game consoles and the like.

As illustrated in FIG. 1, the electronic device 100 may include a host 101, a first semiconductor device 102, and a second semiconductor device 103. The host 101 may include a plurality of modules capable of performing various functions. In an embodiment, the host 101 may include a processor 110, a system memory 120, a power controller 130, a communication module 140, a multimedia module 150, and an input/output module 160. The host 101 may further include a system bus 170 for coupling the modules to each other or to external devices.

The processor 110 may perform logical, control, input/output operations according to instructions of an operating system within the electronic device 100. The processor may control the system memory 120, the power controller 130, the communication module 140, the multimedia module 150, and the input/output module 160, which are included in the host 101, and the first and second semiconductor devices 102 and 130 and a storage unit 104. The processor 110 may include one or more of a central processing unit ("CPU"), a graphic processing unit ("GPU"), a multimedia processor ("MMP"), and a digital signal processor ("DSP"). Furthermore, processor chips having various functions, such as an application processor ("AP"), may be combined and implemented in the form of system on chip.

The system memory 120 may store information on the operating system, data processed by the processor 110, and results of calculation carried out by the processor 110.

The power controller 130 may adjust current and/or voltage to provide suitable current and voltage for operating the processor 110 and the respective components of the electronic device 100. The power controller 130 may include a power management IC ("PMIC"). The power controller 130 may receive power from outside the electronic device 100, or receive power from an internal battery (not illustrated) of the electronic device 100.

The communication module 140 may carry out signal transmission between the processor 110 and a device outside the electronic device 100 according to various communication protocols. The communication module 140 may include a module capable of connecting to a wired network and a module capable of connecting to a wireless network. The wired network module may transmit and receive signals through a communication system such as Local Area Network ("LAN"), Ethernet, or Power Line Communication ("PLC"), and the wireless network module may transmit and receive signals through a communication system such as Bluetooth, Radio Frequency Identification ("RFID"), Long Term Evolution ("LTE"), Wireless broadband Internet ("Wibro"), or Wideband CDMA ("WCDMA").

The multimedia module 150 may carry out calculations or input/output with respect to multimedia data according to control signals provided by the processor 110. The multimedia module 150 may be connected to a camera device, an audio device, a 2D or 3D graphic device, a display device, or an audio/video ("A/V") output device, and input/output multimedia data.

The input/output module 160 may perform input and output operations based on requests from a user interface. The input/output module 160 may be electrically connected to a keyboard, a keypad, a mouse, a stylus, a microphone, a resistive touch screen device, or a capacitive touch screen device so as to receive a signal, and output a signal through a speaker, an earphone, a printer, or a display device.

The first semiconductor device 102 may store data received from the host 101 according to control signals provided by the processor 110 included in the host 101, or output stored data to the host 101. The first semiconductor device 102 may include one or more first memory controllers 210 and one or more first memories 220.

The first memory controller 210 may transmit signals such as a clock, a command, an address, a data strobe signal, and data to the first memory 220 in order to control a data input/output operation of the first memory 220 according to control signals provided by the processor 110 included in the host 101. Such signals may be transmitted through the same channel or different channels.

The first memory 220 may input/output data in response to the clock, the command, the address, and the data strobe signal, which are applied from the first memory controller 210. The first memory 220 may include one or more of a volatile memory device such as Static RAM ("SRAM"), Dynamic RAM ("DRAM"), or Synchronous DRAM ("SDRAM").

The second semiconductor device 103 may recognize a control signal received from the host 10 and start an operation corresponding to the received control signal. The second semiconductor device 103 may include one or more second memory controllers 310 and one or more second memories 320.

The second memory controller 310 may be coupled to the second memory 320 through one or more channels. The second memory controller 310 may control a read, program, or erase operation of the second memory 320 according to control signals provided by the processor 110.

The second memory 320 may be coupled to the second memory controller 310 through a plurality of channels. The second memory 320 may include one or more of nonvolatile memory devices such as Read Only Memory ("ROM"), Programmable ROM ("PROM"), Electrically Erase and Programmable ROM ("EEPROM"), Erasable PROM ("EPROM"), flash memory, Phase change RAM ("PRAM"), Magnetic RAM ("MRAM"), Resistive RAM ("RRAM"), and Ferroelectric RAM ("FRAM"). One channel may be coupled to one or more nonvolatile memory devices. The nonvolatile memory devices coupled to one channel may be coupled to the same control signal bus and data bus.

The first memory 220 may be formed by stacking a plurality of semiconductor chips and interconnecting them using through-chip vias. The first memory 220 may set chip IDs of the plurality of chips to different values using a chip code, and perform a through-chip via test for the plurality of stacked semiconductor chips by changing the chip IDs of the respective semiconductor chips during a test mode period. For example, the first memory 220 may set chip IDs of the plurality of semiconductor chips by using a chip code such that the chip IDs are different from each other.

The first memory 220 may receive external codes through the same transmission path as a transmission path of the chip code and change the chip IDs of the respective semiconductor chips during the test mode period. For example, when performing a test operation, the first memory 220 may receive a predetermined external code to change the chip IDs of the respective semiconductor chips.

When performing the through-chip via test, the first memory 220 may change the chip IDs of the respective semiconductor chips so that, among the plurality of stacked semiconductor chips, a desired semiconductor chip has a certain chip ID which is supposed to electrically connected to a current source and a current for the through-chip via test flows through a through-chip via coupled to the desired semiconductor chip.

In an embodiment, the first memory controller 210 may provide codes, which vary according to the number of semiconductor chips included in the first memory 220, to the first memory 220. In an embodiment, the first memory controller 210 may receive external codes, which vary according to the number of semiconductor chips included in the first memory 220, by the host 101, and provide the external codes to the first memory 220.

When performing the through-chip via test, the host 101 may provide the external codes, which vary according to the number of semiconductor chips included in the first memory 220, to the first memory controller 210.

The electronic device 100 may include a storage unit (not illustrated) for storing large-volume data. The electronic device 100 may also use the storage unit 104 outside the electronic device to store large-volume data. The storage unit 104 may store data and commands for various components of the electronic device 100. The storage unit 104 may include one or more Hard Disk Drives ("HDD") or Solid State Drives ("SSD").

The components illustrated in FIG. 1 are classified according to the functions thereof, but not necessarily physically distinguished from each other. For example, two or more components of FIG. 1 may be formed in one physical semiconductor chip. For example, two or more components of FIG. 1 may be packaged in a single package.

Figure 2:
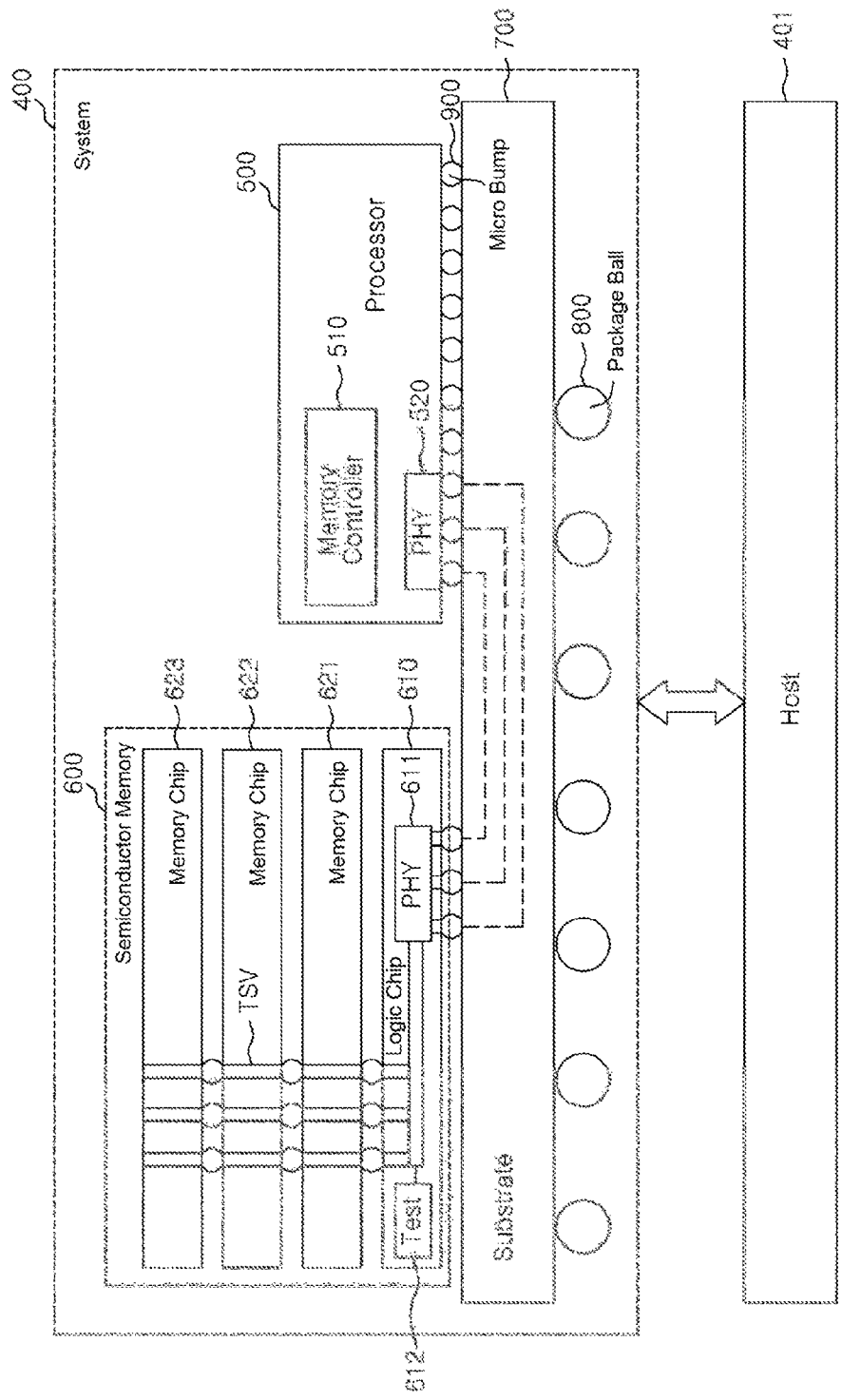
FIG. 2 is a diagram illustrating an example of a system 400 in which two or more components of FIG. 1 are formed in one package according to an embodiment of the present disclosure.

FIG. 2 is a diagram illustrating an example of a system 400 in which two or more components of FIG. 1 are formed in one package according to an embodiment of the present disclosure.

As illustrated in FIG. 2, the system 400 may include a substrate 700, a semiconductor memory 600, and a processor 500. The system 400 may be implemented in the form of a system in package, a multi-chip package, a system on chip, a package on package including a plurality of packages.

The substrate 700 may provide a signal path for data communication between the processor 500 and the semiconductor memory 600. The substrate 700 may also include a logic circuit for providing a signal path and a logic circuit for a test. The substrate 700 may be implemented in various forms such as an interposer and a Printed Circuit Board ("PCB"). The substrate 700 may provide a signal path including an electrical connection path such as a metal layer or through-chip via.

The substrate 700 may be electrically coupled to an external device through package balls 800 such as ball grid arrays, bump balls, and Controlled Collapse Chip Connection ("C4") bumps. The external device may include a host 401 which operates in connection with the system. The substrate 700 may be electrically coupled to the processor 500 and the semiconductor memory 600 through, for example, micro bumps 900.

The processor 500 may communicate with the host 401 through a system bus (not illustrated) and the substrate 700, and perform various arithmetic and logical operations requested by the host 401. The processor 500 may include one or more of a CPU, a GPU, an MMP, and a DSP. Furthermore, the processor 500 may be implemented in the form of a system on chip, a system in package, or a package on package, in which processor chips having various functions (e.g., AP) are combined. The processor 500 may access the semiconductor memory 600 through the memory controller 510, and a physical layer 520 of the memory controller 510 and a physical layer 611 of the semiconductor memory 600 may convert signals to meet standards of interfaces between them. In an embodiment, the first memory controller 510 may be provided in the processor 500. The first memory controller 510 may be separately provided outside the processor 500. In an embodiment, the memory controller 510 may be one of the stacked semiconductor chips (e.g., bottom semiconductor chip 610) of the semiconductor memory 600. In an embodiment, the memory controller 510 may be disposed over the substrate 700 separately from the semiconductor memory 600 and the processor 500. The memory controller 510 may provide a command, an address, a clock, and data to the semiconductor memory 600 in order to control the semiconductor memory 600, and receive data outputted from the semiconductor memory 600. The physical layers 520 and 611 may include an interface circuit which converts a signal transmitted from the processor 500 or the memory controller 510 into a signal suitable for being used in the semiconductor memory 600 or converts a signal transmitted from the semiconductor memory 600 into a signal suitable for being used in the processor 500 or the memory controller 510.

The semiconductor memory 600 may include a memory device having a plurality of semiconductor chips stacked therein. The semiconductor memory 600 may include a logic chip 610 and a plurality of memory chips 621 to 623 which are sequentially stacked over the logic chip 610. The logic chip 610 and the plurality of memory chips 621 to 623 may be electrically coupled to each other through through-chip vias TSV and micro bumps 900. The logic chip 610 may relay transmission of signals and data between the memory controller 510 and the plurality of memory chips 621 to 623. The logic chip 610 may include the physical layer 611, a test circuit 612, and a repair-related circuit (not illustrated). The physical layer 611 may receive signals or data transmitted from the processor 500 (e.g., the memory controller 510 and the physical layer 520), amplify signals or data outputted from the plurality of memory chips 621 to 623, and transmit the amplified signals or data to the physical layer 520. The test circuit 612 may be coupled to the processor 500 (e.g., the memory controller 510) to perform a test for the plurality of memory chips 620, or coupled to the host 401, for example, a test device to perform a test for the plurality of memory chips 621 to 623. Furthermore, a test for the semiconductor memory 600 may be independently performed through the test circuit 612. The test circuit 612 may include circuits capable of performing tests related to the plurality of memory chips 621 to 623 and the logic chip 610 at a wafer level and a package level. The test circuit 612 may include various memory test-related circuits such as a built-in self test circuit, a self repair circuit, and a self stress circuit. For example, the test circuit 612 may perform a connection test for a through-chip via or micro bump, a boundary scan test, a burn-in stress test, a data input/output test, a data compression test and the like. Furthermore, the test circuit 612 may include a repair logic configured to replace a defective memory cell with a redundancy memory cell. The plurality of memory chips 621 to 623 may include a data storage space for storing data transmitted from the processor or the memory controller 510 through the logic chip 610.

Each of the memory chips 621 to 623 may further include logic circuits for performing a test in connection with the test circuit 612 of the logic chip 610.

The semiconductor memory 600 may set the chip IDs of the respective memory chips 621 to 623 by using a chip code such that the chip IDs are different from each other, and perform a through-chip via test for the memory chips 621 to 623 by changing the chip IDs of the respective memory chips 621 to 623 during a test mode period.

The semiconductor memory 600 may change the chip IDs of the respective memory chips 621 to 623 during the test mode period by transmitting external codes through the same transmission path as the transmission path of the chip code.

When performing the through-chip via test, the semiconductor memory 600 may change the chip IDs of the respective memory chips 621 to 623 so that, between the plurality of memory chips 621 to 623, a desired memory chip has a certain chip ID which is supposed to electrically connected to a current source and a current for the through-chip via test flows through a through-chip via coupled to the desired memory chip.

In an embodiment, the processor 500 may provide codes, which vary according to the number of the memory chips 621 to 623, to the semiconductor memory 600. In an embodiment, the processor 500 may receive codes calculated by the host 401 and provide the received codes to the semiconductor memory 600 in order to perform the through-chip via test.

When performing the through-chip via test, the host 401 may provide external codes, which vary according to the number of the memory chips 612 to 623, to the processor 500.

Figure 3:
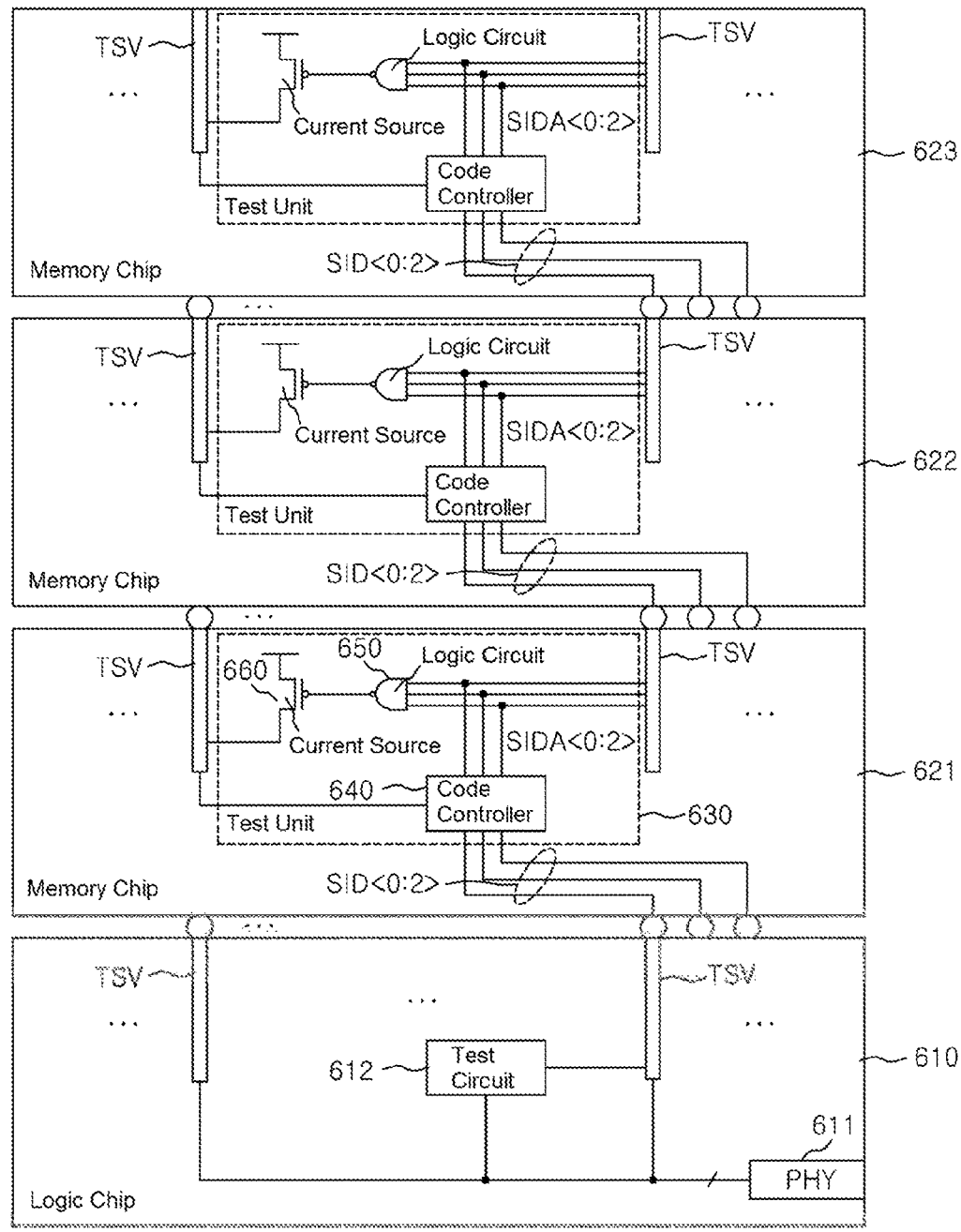
FIG. 3 is a block diagram illustrating a configuration example of a semiconductor memory 600 according to an embodiment of the present disclosure.

FIG. 3 is a block diagram illustrating a configuration example of a semiconductor memory 600 according to an embodiment of the present disclosure.

The semiconductor memory 600 according to an embodiment of the present disclosure may be formed by staking a plurality of chips and interconnecting them using through-chip vias. The semiconductor memory 600 may set the chip IDs of the respective chips using a chip code such that the chip IDs are different from each other, and perform a through-chip via test for the memory chips by changing the chip IDs of the respective memory chips during a test mode period.

The semiconductor memory 600 may change the chip IDs of the respective chips by transmitting external codes through the same transmission path as a transmission path of the chip code during the test mode period.

When performing the through-chip via test, the semiconductor memory 600 may change the chip IDs of the respective chips so that, among the plurality of stacked semiconductor chips, a desired semiconductor chip has a certain chip ID which is supposed to electrically connected to a current source and a current for the through-chip via test flows through a through-chip via coupled to the desired semiconductor chip.

As illustrated in FIG. 3, the semiconductor memory 600 according to an embodiment may include a plurality of stacked chips 610 and 621 to 623, which include a logic chip 610 and a plurality of memory chips 621 to 623.

The logic chip 610 may set its chip ID to an initial value, and transmit the chip ID set to the initial value or an external code as a chip code SID<0:2> to an upper chip.

The logic chip 610 may include a plurality of through-chip vias TSV, a test circuit 612, and a physical layer 611.

The test circuit 612 may couple nodes determining the respective signal bits of the chip ID to a ground voltage terminal VSS, and set the chip ID to the initial value, for example, '000.' The physical layer 611 may receive an external code and transmit the received code to the test circuit 612.

Each of the memory chips 621 to 623 may have an adjusted code SIDA<0:2>, which may be obtained by adding a predetermined value (e.g., '1') to the chip code SID<0:2> provided from a lower chip, as its chip ID.

Each of the memory chips 621 to 623 may activate the current source thereof, when the adjusted code SIDA<0:2>, which is obtained by adding the predetermined value to the chip code SID<0:2> provided from the lower chip, coincides with a target value during a test mode period.

Each of the memory chips 621 to 623 may include an ID setup and test unit 630, which may set the chip ID using the chip code SID<0:2> provided from the lower chip through the plurality of through-chip vias TSV according to whether the current mode is the test mode, or perform a test for the plurality of through-chip vias TSV, for example, an open/short test.

The ID setup and test unit 630 may include a code controller 640, a logic element 650, and a current source 660.

The current source 660 may include a transistor coupled to the plurality of through-chip vias TSV, and the source terminal of the transistor may be coupled to a power supply terminal.

The transistor may include a PMOS transistor.

The logic circuit 650 may activate the current source 660 when the value of the adjusted code SIDA<0:2> outputted from the code controller 640 coincides with a target value, for example, '111.'

Figure 4:
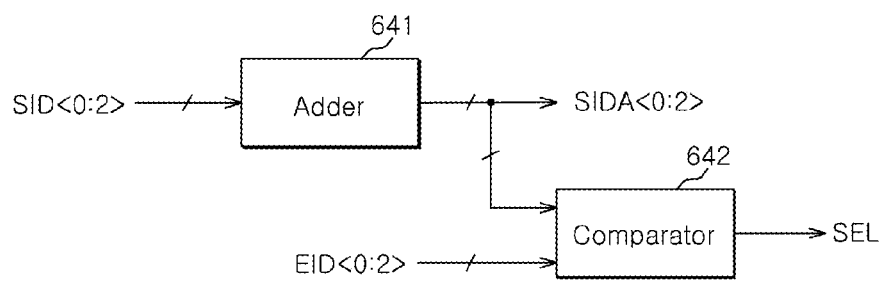
FIG. 4 is a diagram illustrating a configuration example of a code controller 640 of FIG. 3.

FIG. 4 is a diagram illustrating a configuration example of the code controller 640 of FIG. 3.

As illustrated in FIG. 4, the code controller 640 may include an adder 641 and a comparator 642.

The adder 641 may generate the adjusted code SIDA<0:2> by adding a predetermined value (e.g., '1') to the chip code SID<0:2>.

The comparator 642 may compare a chip designation code EID<0:2> inputted in a normal mode to the adjusted code SIDA<0:2>, and generate a signal SEL for determining whether to select a chip.

The ID setting operation and the test operation according to an embodiment of the present disclosure will be described as follows.

First, the chip ID setting operation will be described.

In the semiconductor memory 600 of FIG. 3, the plurality of chips 610 and 621 to 623, which include the logic chip 610 and the plurality of memory chips 621 to 623, are stacked, and thus the chip IDs may be automatically set.

The logic chip 610 may have a chip ID set to an initial value of '000', and transmit the chip ID of '000' as the chip code SID<0:2> to the upper chip, e.g., the memory chip 621 through the through-chip vias TSV.

The memory chip 621 may set '001' as its chip ID, which is an adjusted code SIDA<0:2> obtained by adding '1' to the chip code SID<0:2> transmitted from the lower chip.

The memory chip 621 may provide its chip ID (e.g., '001') to an upper chip (e.g., the memory chip 622) through the through-chip vias TSV.

According to the above-described method, the chip IDs of the logic chip 610 and the memory chips 621 to 623 may have different values from one another.

Next, the through-chip via test operation will be described.

A host or memory controller may generate external codes having different values. The external codes may be generated by calculating according to the number of stacked chips such that the current source of a chip at a desired position is activated. For example, the external codes may be generated so that the uppermost chip among the plurality of chips stacked in the semiconductor memory 600 is activated. The host or memory controller may also provide a test mode command to the semiconductor memory 600.

The host or memory controller may include one or more of the host 101, the first memory controller 210, the second memory controller 310, and the processor 500, which have been described with reference to FIGS. 1 and 2.

FIG. 3 illustrates that the three memory chips 621 to 623 are stacked over the logic chip 610. In this example, the host or memory controller may generate '100' as the external code.

According to the test mode command transmitted from the host or memory controller, the semiconductor memory 600 may enter a test mode.

In the test mode, the logic chip 610 may transmit the external code of '100' received through the physical layer 611 as the chip code SID<0:2> to a chip stacked over the logic chip 610 through the same transmission path as the transmission path of the chip code SID<0:2>. For example, the logic chip 610 may transmit the external code of '100' received through the physical layer 611 as the chip code SID<0:2> to the memory chip 621 through the same transmission path as the transmission path of the chip code SID<0:2> during the chip ID setting operation.

The chip ID of the memory chip 621 may be temporarily changed to an adjusted code SIDA<0:2> of '101,' which is obtained by adding '1' to the chip code SID<0:2> transmitted from the lower chip in the test mode.

The memory chip 621 may transmit the chip ID of '101' to a chip stacked over the memory chip 621, e.g., the memory chip 622 through the same transmission path as the transmission path of the chip code SID<0:2> during the chip ID setting operation. The chip ID of the memory chip 622 may be temporarily changed to an adjusted code SIDA<0:2> of '110,' which is obtained by adding '1' to the chip code SID<0:2> transmitted from the lower chip in the test mode.

The chip ID of the memory chip 623 may be temporarily changed to '111' which is obtained by adding '1' to the chip code SID<0:2> transmitted from the lower chip in the test mode.

In an embodiment, a current source coupled to a memory chip, which has chip ID of '111' may be preset as a current source for the test mode. Since the chip ID of the memory chip 623 among the plurality of memory chips 621 to 623 is '111', the current source 650 coupled to the through-chip vias TSV of the memory chip 623 may be activated.

Then, a current path from the memory chip 623 to the lower memory chips 622 and 622 and the logic chip 610 may be formed. The host or memory controller may perform an open/short test for the through-chip vias TSV of the semiconductor memory 600 using the current path.

The current source of the uppermost chip may be activated during the open/short test for the through-chip vias TSV. In an embodiment, a chip including a defective through-chip via may be identified by changing the external code.

For example, when a defective through-chip via is detected in a state where the external code is set to '100', the position of a chip including the defective through-chip via cannot be identified.

In an embodiment, the host or memory controller may identify which memory chip among a plurality of memory chips has defective through-chip via by changing the value of the external code to '101' or '110' and then activating the current source of the memory chip 622 or 621 to perform a test.

For another example, when seven memory chips are stacked over the logic chip and the current source of the uppermost chip is intended to be activated, the host or memory controller may generate '000' as an external code. When the current source of a third upper chip from the logic chip among the entire chips is intended to be activated, the host or memory controller may generate the external code as '100.'

When the test mode is completed, the chip IDs of the memory chips 621 to 623, which were changed during the test mode period, may be recovered to the original values.

This is because, as the test mode is ended, the chip ID '000' of the logic chip 610 is transmitted to the upper chip.

While certain embodiments have been described above, it will be understood to those skilled in the art that the embodiments described are by way of example only. Accordingly, the semiconductor memory described herein should not be limited based on the described embodiments. Rather, the semiconductor memory described herein should only be limited in light of the claims that follow when taken in conjunction with the above description and accompanying drawings.

What is claimed is:

1. A semiconductor memory comprising a plurality of semiconductor chips which are interconnected using through-chip vias,
    wherein the semiconductor memory sets chip IDs of the plurality of semiconductor chips by changing a chip code such that the chip IDs are different from each other, and performs a through-chip via test for the plurality of semiconductor chips by activating a current source of a desired chip of the plurality of semiconductor chips to flow a current from the current source through the through-chip vias,
    wherein the activating the current source of the desired chip is operated by changing the chip IDs of the plurality of semiconductor chips again during a test mode period.

2. The semiconductor memory according to claim 1, wherein the semiconductor memory changes the chip IDs of the the plurality of semiconductor chips during the test mode period by transmitting an external code through the same transmission path as a transmission path of the chip code.

3. The semiconductor memory according to claim 1, wherein one of the plurality of semiconductor chips is a logic chip, and
    the logic chip is configured to set a chip ID thereof to an initial value, and transmit the chip ID or an external code as the chip code to an upper semiconductor chip of the plurality of semiconductor chips.

4. The semiconductor memory according to claim 1, wherein the plurality of semiconductor chips comprise a logic chip and a plurality of memory chips stacked over the logic chip, and
    each of the memory chips is configured to set a value obtained by adding a predetermined value to the chip code provided from a lower chip, as the chip ID thereof.

5. The semiconductor memory according to claim 1, wherein the plurality of semiconductor chips comprise a logic chip and a plurality of memory chips stacked over the logic chip, and
    each of the memory chips is configured to activate a current source thereof, when a value obtained by adding a predetermined value to the chip code provided from a lower chip coincides with a target value.

6. The semiconductor memory according to claim 1, wherein each of the plurality of semiconductor chips excluding the lowermost chip of the plurality of semiconductor chips comprises:
    a plurality of through-chip vias; and
    an ID setup and test unit configured to set the chip ID using the chip code provided from a lower chip of the plurality of semiconductor chips or perform the through-chip via test for the plurality of through-chip vias according to whether a current mode is a test mode.

7. The semiconductor memory according to claim 1, wherein each of the plurality of semiconductor chips excluding the lowermost chip of the plurality of semiconductor chips comprises:
    a plurality of through-chip vias;
    a current source coupled to the plurality of through-chip vias;
    an adder configured to add a predetermined value to the chip code; and
    a logic element configured to activate the current source when an output of the adder coincides with a target value.

8. The semiconductor memory according to claim 7, further comprising a comparator configured to compare an external code inputted in a normal mode to the output of the adder, and determine whether to select a chip of the plurality of semiconductor chips.

9. The semiconductor memory according to claim 1, wherein the chip IDs changed during the test mode period are recovered there original values when the test mode is completed.

10. A system comprising:
    a semiconductor memory configured to set chip IDs of a plurality of semiconductor chips by changing a chip code such that the chip IDs are different from each other, and perform a through-chip via test for the plurality of semiconductor chips by activating a current source of a desired chip of the plurality of semiconductor chips to flow a current from the current source through the through-chip vias,
    wherein the activating the current source of the desired chip is operated by changing the chip IDs of the plurality of semiconductor chips again during a test mode period;
    a processor configured to provide external codes, which vary according to the number of the plurality of chips in the semiconductor memory, to the semiconductor memory to perform the through-chip via test; and a substrate configured to provide a signal path for communication between the processor and the semiconductor memory.

11. The system according to claim 10, wherein the processor is configured to communicate with a host through the substrate.

12. The system according to claim 10, wherein the semiconductor memory is configured to change the chip IDs of the plurality of semiconductor chips during the test mode period by transmitting the external codes through the same transmission path as a transmission path of the chip code.

13. The system according to claim 10, wherein one of the plurality of semiconductor chips is a logic chip, and
 the logic chip is configured to set a chip ID thereof to an initial value, and transmit the chip ID set to the initial value or an external code as the chip code to an upper semiconductor chip of the plurality of semiconductor chips.

14. The system according to claim 10, wherein the plurality of semiconductor chips comprise a logic chip and a plurality of memory chips stacked over the logic chip, and
 each of the memory chips is configured to set a value obtained by adding a predetermined value to the chip code provided from a lower chip, as a chip ID thereof.

15. The system according to claim 10, wherein the plurality of semiconductor chips comprise a logic chip and a plurality of memory chips stacked over the logic chip, and
 each of the plurality of chips comprises:
 a plurality of through-chip vias; and
 an ID setup and test unit configured to set the chip ID using the chip code provided from a lower chip of the plurality of semiconductor chips or perform the through-chip via test for the plurality of through-chip vias according to whether a current mode is a test mode.

16. The system according to claim 10, wherein the plurality of semiconductor chips comprise a logic chip and a plurality of memory chips stacked over the logic chip, and
 each of the plurality of memory chips comprises:
 a plurality of through-chip vias;
 a current source coupled to the plurality of through-chip vias;
 an adder configured to add a predetermined value to the chip code; and
 a logic element configured to activate the current source when an output of the adder coincides with a target value.

17. The system according to claim 16, further comprising a comparator configured to compare an external code inputted in a normal mode to the output of the adder, and determine whether to select a chip of the plurality of semiconductor chips.

18. The system according to claim 10, wherein the chip IDs changed during the test mode period are recovered there original values when the test mode is completed.

* * * * *